(12) United States Patent
Valdes Garcia et al.

(10) Patent No.: US 9,559,747 B1
(45) Date of Patent: Jan. 31, 2017

(54) EFFICIENT TRANSMIT AND RECEIVE SWITCHES

(71) Applicant: INTERNATIONAL BUSINESS MACHINES CORPORATION, Armonk, NY (US)

(72) Inventors: Alberto Valdes Garcia, Chappaqua, NY (US); Scott K. Reynolds, Amawalk, NY (US); Bodhisatwa Sadhu, White Plains, NY (US); Yahya Mesgarpour Tousi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/881,644

(22) Filed: Oct. 13, 2015

(51) Int. Cl.
*H04B 1/38* (2015.01)
*H04B 1/48* (2006.01)
*H04B 1/04* (2006.01)

(52) U.S. Cl.
CPC .............. *H04B 1/48* (2013.01); *H04B 1/0475* (2013.01); *H04B 2001/0408* (2013.01); *H04B 2001/485* (2013.01)

(58) Field of Classification Search
CPC ....................................................... H04B 1/18
USPC ........................................................ 375/219
See application file for complete search history.

(56) References Cited

U.S. PATENT DOCUMENTS

| 2005/0157672 | A1 | 7/2005 | Dodel |
| 2005/0255810 | A1* | 11/2005 | Monroe ................... H04B 1/48 455/78 |
| 2006/0262007 | A1 | 11/2006 | Bonthron et al. |
| 2008/0122693 | A1 | 5/2008 | Needham et al. |
| 2010/0060521 | A1 | 3/2010 | Hayes et al. |
| 2012/0280754 | A1* | 11/2012 | Gorbachov ............. H03F 1/565 330/302 |
| 2014/0253246 | A1* | 9/2014 | Mei ....................... H03F 1/0288 330/295 |

FOREIGN PATENT DOCUMENTS

| EP | 1739847 A2 | 1/2007 |
| WO | WO 2007100864 A2 | 9/2007 |
| WO | WO 2015043612 A1 | 4/2015 |

OTHER PUBLICATIONS

Wang, Ruey-Lue, et al; "3~ 5 GHz Cascoded UWB Power Amplifier." In Circuits and Systems, 2006. APCCAS 2006. IEEE Asia Pacific Conference on, pp. 367-369. IEEE, Dec. 4-7, 2006.

* cited by examiner

*Primary Examiner* — Lihong Yu
(74) *Attorney, Agent, or Firm* — Tutunjian & Bitetto, P.C.; Vazken Alexanian

(57) ABSTRACT

Transmit/receive switches and methods for radio control include connecting a first reactive impedance in parallel with a power amplifier on a transmit path during reception to neutralize a reactive impedance of the power amplifier and to prevent received signals from entering the transmit path. The first reactive impedance is disconnected during transmission.

15 Claims, 6 Drawing Sheets

EFFICIENT TRANSMIT AND RECEIVE SWITCHES

BACKGROUND

Technical Field

The present invention relates to switches for changing operation between transmitter and receiver paths on a single antenna.

Description of the Related Art

Radio frontends that act as both a transmitter and receiver use a transmit/receive switch to change a path connected to the antenna between a transmit and a receive path. The objective of such a switch is to enable the radio to select between two states of operation.

Referring now to FIG. 1, a prior art transmit/receive switch is shown. A power amplifier (PA) 102 is connected to an antenna 108 along a transmit path and a low noise amplifier (LNA) 104 is connected to the same antenna 108 along a receive path. In each path, a quarter-wavelength transmission line 106 is in series with the respective amplifier and a switch 110 to ground is placed in parallel. Turning on one of the switches 106 creates, along with the respective transmission line 106, an apparent electrical open to the radio frequency (RF) signals on the path. This allows one branch to be turned off while the other is active.

Since the switches 110 and transmission lines 106 reside at the very front of the transceiver, their performance is important for the overall system. For example the loss of the switch 110 and the associated transmission line 106 directly reduce the efficiency and compression point during transmit mode and the noise figure during receive mode. The transmitter efficiency is significantly crucial in large phased array transceivers because as the efficiency drops, the required DC power required to produce a desired output power increases proportionally. This means that the switch insertion loss in the transmit mode is important to the overall power consumption and temperature of a large transceiver system. As a result it is highly beneficial to have a switch with low insertion loss in transmit mode.

One end of the two transmission lines 106 connects together and to the antenna 108, while the input to each side is connected to a respective switch 110. In this scheme, the presence of the transmission lines 106 is needed for the operation of the switches 106 in "off" mode. During off mode of a branch, the combination of the quarter wavelength transmission line and the switch are responsible for creating a high input impedance. However, a problem with this method is that, during the "on" state, the RF signal has to pass the through the transmission line that connects the module to the antenna. This extra line introduces undesired loss in the signal path, particularly at higher frequencies (e.g., at the tens of gigahertz). In other words, the transmission line is a means to turn off the branch, but is harmful when the branch is on.

SUMMARY

A radio front-end includes a transmit path comprising a power amplifier. A receive path includes a low-noise amplifier. A transmit/receive switch is configured to connect the transmit path and the receive path to an antenna, the transmit/receive switch comprising a first switched reactive impedance connected in parallel with the power amplifier, said first switched reactive impedance having an impedance configured to neutralize a reactive impedance of the power amplifier.

A method for radio control includes connecting a first reactive impedance in parallel with a power amplifier on a transmit path during reception to neutralize a reactive impedance of the power amplifier and to prevent received signals from entering the transmit path. The first reactive impedance is disconnected during transmission.

A system for radio control includes a transmit/receive switch control configured to connect a first reactive impedance in parallel with a power amplifier on a transmit path during reception to neutralize a reactive impedance of the power amplifier and to prevent received signals from entering the transmit path and further configured to disconnect the first reactive impedance during transmission.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention implement a transmit/receive switch that can create an apparent electrical open on a transmit or receive branch without using a transmission line in the respective path. This results in lower insertion loss as compared to switches that employ a quarter-wavelength transmission line, particularly on the transmit side, without having to compromise performance of the receive branch. As a result, the present embodiments increase the efficiency of the branches and the compression point by more than 1 dB. The increased efficiency results in significantly less power being wasted and allows the transmitter to run cooler, as less of the power is converted to heat. Also, due to elimination of transmission lines, the area footprint is nearly half of the conventional design.

Figure 1:
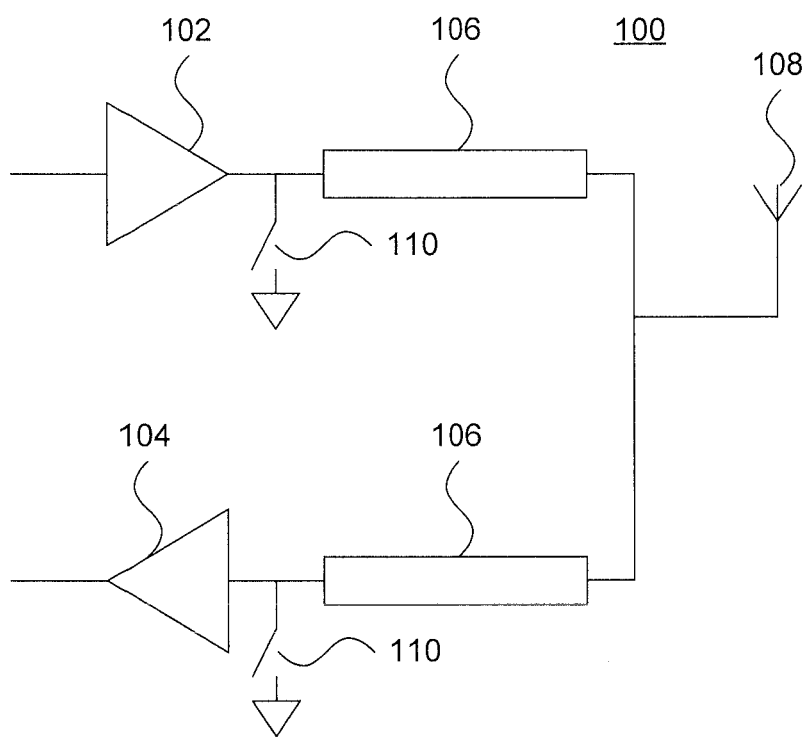
FIG. 1 is a diagram of a transmit/receive switch circuit in accordance with the prior art.
Figure 2:
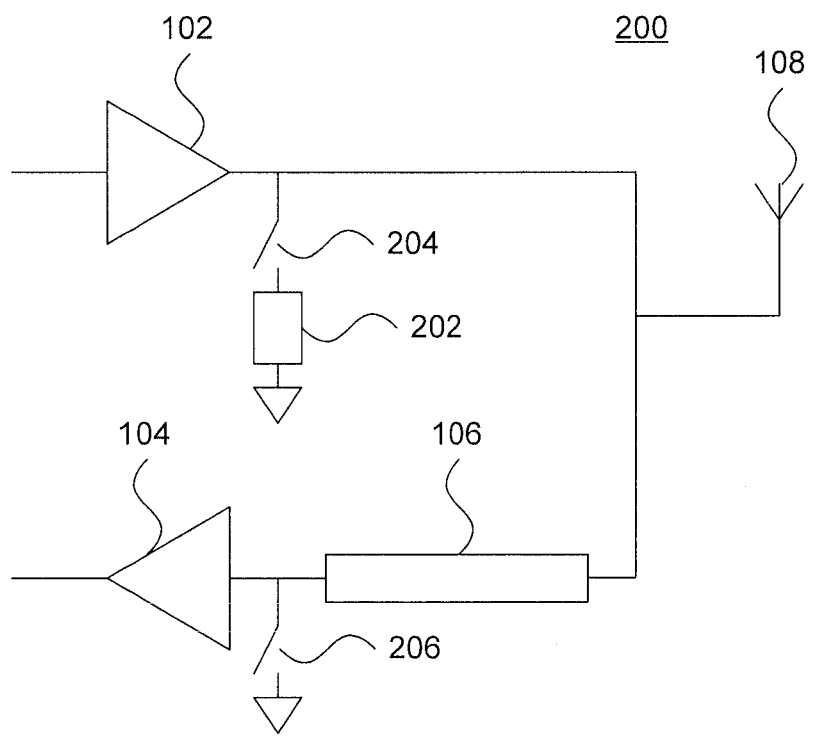
FIG. 2 is a diagram of a transmit/receive switch circuit in accordance with the present principles.

Referring now to the drawings in which like numerals represent the same or similar elements and initially to FIG. 2, a transmit/receive switch 200 according to the present embodiments is shown. As in the conventional case, a power amplifier (PA) 102 and a low-noise amplifier (LNA) 104 are on respective transmit and receive paths to an antenna 108. In this embodiment, the transmission line 106 on the transmit path has been removed. A reactive impedance 202 is added behind the transmit-path switch 204. The elements on the receive path are, in this example, kept the same as in the conventional design, using the transmission line 106 and receive path switch 206 to select or block signals from the antenna 108 on the receive path. Notably, the output of the PA 102 is directly connected to the antenna 108. It should be noted that a "direct" connection herein refers to a connection of minimum or nearly minimum length as dictated by the minimum feature pitch of the fabrication process or other design considerations. The connection between the PA 102 and the antenna 108 is much smaller than a quarter wavelength. This connection therefore represents a negligible loss as compared to a quarter wavelength transmission line.

During a transmission stage, the transmit branch switch 204 is turned off, resulting in a direct connection between the PA 102 and the antenna 108. Meanwhile the receive switch 206 is turned on, resulting in a high impedance looking into the receive branch through the remaining transmission line 106. Because of the direct connection of the PA 102 to the antenna 108, there is no extra loss due to switching from the transmission branch. This increases the efficiency and compression point of the transmitter.

During receive mode, the antenna guides a radio frequency (RF) signal into the input of the LNA 104 while the PA output impedance is high. This high impedance results naturally from turning off the transmitter, which puts the real part of the output impedance at a high state due to the high resistance of the PA's final stage. While the PA's impedance is not infinitely large, it is large enough compared to the antenna's impedance to be effectively an electrical open. Thus, only the reactive admittance needs to be resonated out, which is accomplished using reactive impedance 202 when the transmit branch switch 204 is turned on. The reactive impedance 202 will have a reactive admittance that is opposite to that of the PA 102. Turning on the transmit branch switch 204 thus creates an effective electrical open on the transmit branch (preventing RF signals from progressing further down the transmit branch) while turning off the receive branch switch 206 allows impedance match at the receive path for the signal at the antenna to pass to the LNA 104.

Figure 3:
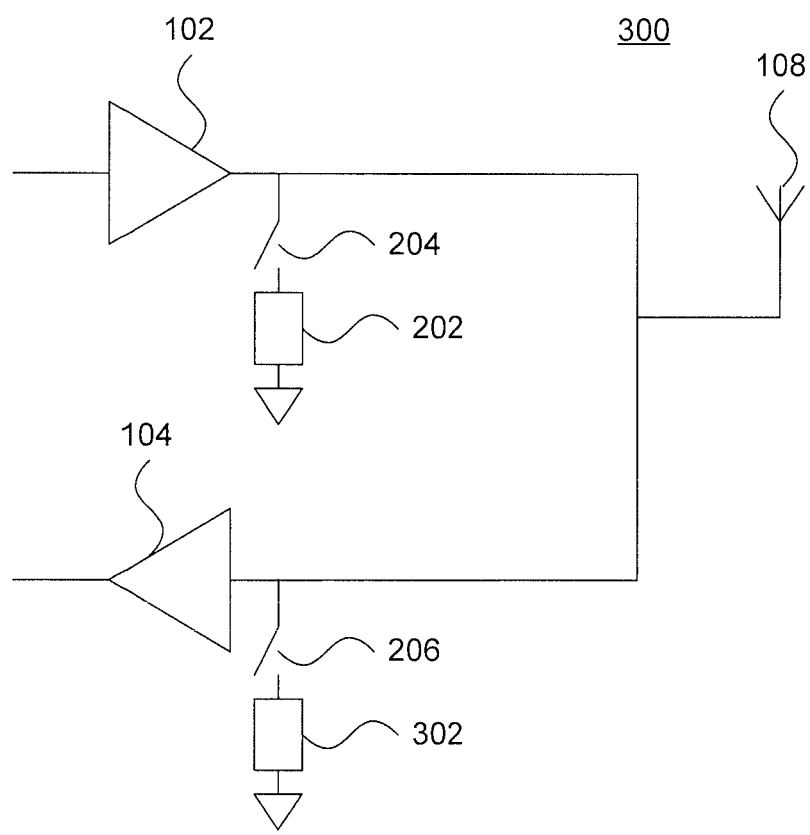
FIG. 3 is a diagram of a transmit/receive switch circuit in accordance with the present principles.

Referring now to FIG. 3, an embodiment is shown that removes both transmission lines 106 to maximize the benefits of the present principles. Although for many systems the PA power dominates the entire system's performance, some benefit may be gained from removing the transmission line 106 from the receive path as well, for example by reducing the area used by the device and reducing the insertion loss between the antenna and the LNA input, which in turn would reduce the noise factor. It should be noted that this embodiment is only appropriate for LNAs that have a high impedance input in their off state—if the LNA in a given system has a relatively low input impedance, a transmission line on the receive path may still be needed.

In this transmit/receive switch 300, the transmission path of FIG. 2 is combined with a similar receive path as shown, placing an impedance 302 parallel to the LNA 104 provides benefits similar to those set forth above with respect to the transmit path. The impedance of the LNA 104 when inactive is exploited, along with the reactive impedance 302, to present an electrical open when the receive path switch 206 is turned on during transmission.

Figure 4:
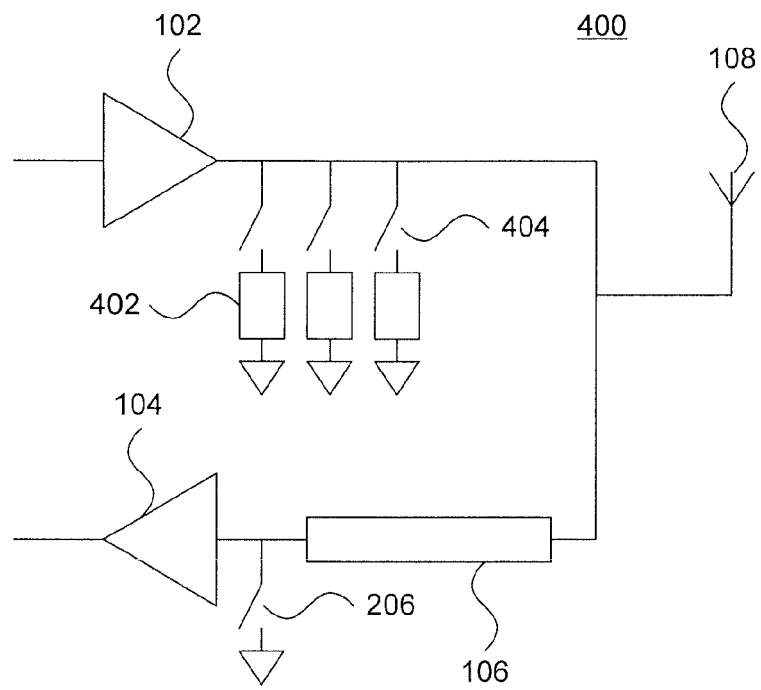
FIG. 4 is a diagram of a transmit/receive switch circuit in accordance with the present principles.

Referring now to FIG. 4, an alternative embodiment of a transmit/receive switch 400 is shown. It is not always known in advance what the precise output impedance of the PA 102 will be. In particular, while it can be known that the PA 102's output impedance is likely to be, e.g., generally capacitive or inductive, the precise number will ultimately depend on process variations in the actual implementation. This can result from imperfections in fabrication, from temperature or other environmental variations, and from time-based forms of circuit degradation.

To solve this problem, a set of impedances 402 are arranged in parallel with the PA 102, each being switched by a respective switch 404. If, for example, the reactive impedance of the PA 102 is expected to be inductive, the parallel impedances 402 may be capacitors that are switched on to add to resonate with the inductive impedance of the PA 102. The particular impedances 402 that are engaged are selected according to a measurement of reactive impedance of the PA 102.

Figure 5:
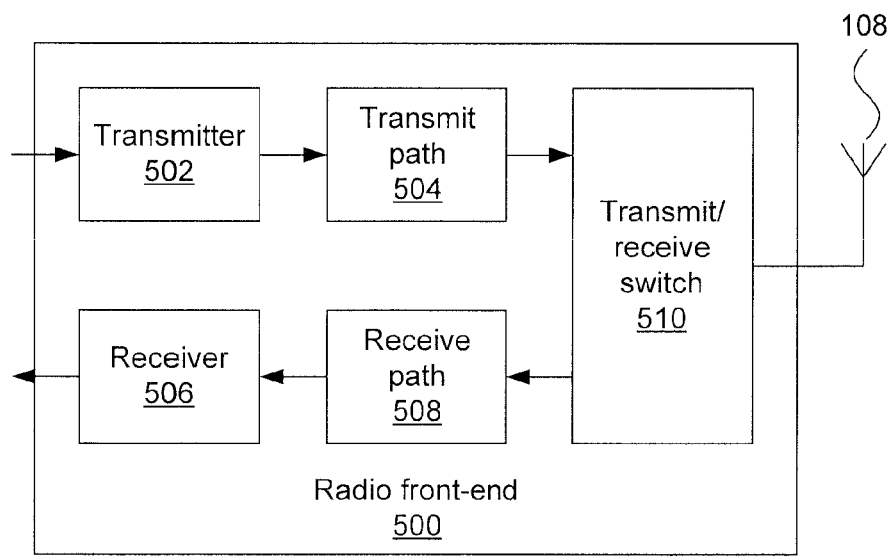
FIG. 5 is a diagram of a radio front-end including a transmit/receive switch in accordance with the present principles.

Referring now to FIG. 5, the embodiments of the present invention are shown in the broader context of a radio front-end 500. The radio front-end 500 includes a transmitter 502 and a receiver 506. The transmitter 502 receives signals that may include, e.g., digital or analog signals to be transmitted. The transmitter 502 converts the signals to RF signals using, for example, one or more forms of coding and modulation. The signals pass through a transmit path 504 which may perform other operations such as phase shifting and amplification. In this embodiment, it is contemplated that the PA 102 described above will be part of the transmit path 504.

A transmit/receive switch 510, which may be embodied according to any of the above-discussed embodiments connects the transmit path 504 directly to the antenna 108 during a transmission stage. The transmit/receive switch 510 may also directly connect the receive path to the antenna 108 as described above with respect to FIG. 3. The transmit/receive switch 510 controls whether the front-end 500 is in transmit-mode or receive-mode. During a receive stage, the transmit/receive switch 510 receives an RF signal from the antenna 108 and passes it to the receive path 508.

The receive path 508 may perform any needed operations on the raw RF signal, including for example amplification and phase shifting. The RF signal then passes to the receiver 506 for demodulation/decoding to extract the data, whether in an analog or digital form.

The radio front-end 500 may be just one of multiple such front-ends in a single radio system. For example, it is specifically contemplated that the radio front-end 500 may be part of a phased array transceiver that directs its overall gain in a particular direction by beam shaping. This is accomplished by changing settings to relative phase shifts and amplitudes between different front-ends 500 in the transmit paths 504 and receive paths 508.

Figure 6:
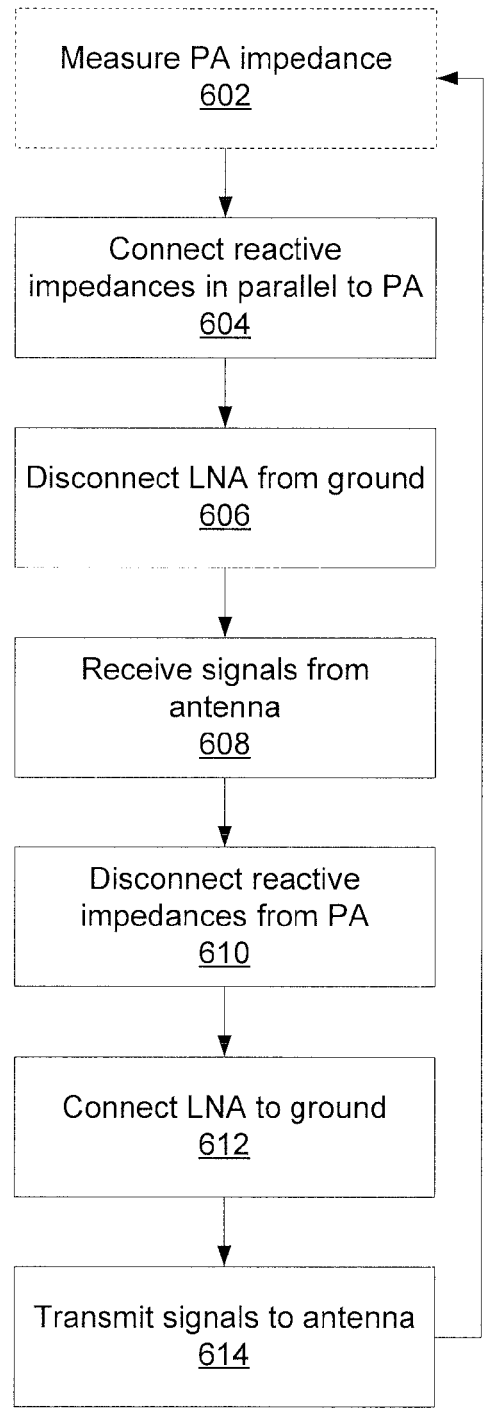
FIG. 6 is a block/flow diagram of a method of switching between transmit and receive paths in accordance with the present principles.

Referring now to FIG. 6, a method of operating a radio front-end is shown. Block 602 is an optional step measures that PA impedance in accordance with the embodiment of FIG. 4. This step may be performed once, during an initial calibration step, or may be performed periodically to account for variations in the reactive impedance of the PA 102. Block 604 connects reactive impedances 202/402 in parallel with the PA 102. If multiple impedances 402 are used, then the number and strength of the capacitors used will be engaged in accordance with the measured reactive PA impedance of block 602. Block 606 reduces the impedance of the receive branch 508 by, e.g., disconnecting the LNA from the parallel ground. The transmit path 504 now has a high impedance while the receive path 508 has a low impedance, such that signals from the antenna 108 travel down the receive path 508.

Block 610 then disconnects the reactive impedances from the PA while block 612 turns the receive path 508 back to a high impedance by, e.g., connecting the LNA 104 to ground in parallel. Block 614 then transmits signals along the transmit path 504 to the antenna 108.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 7:
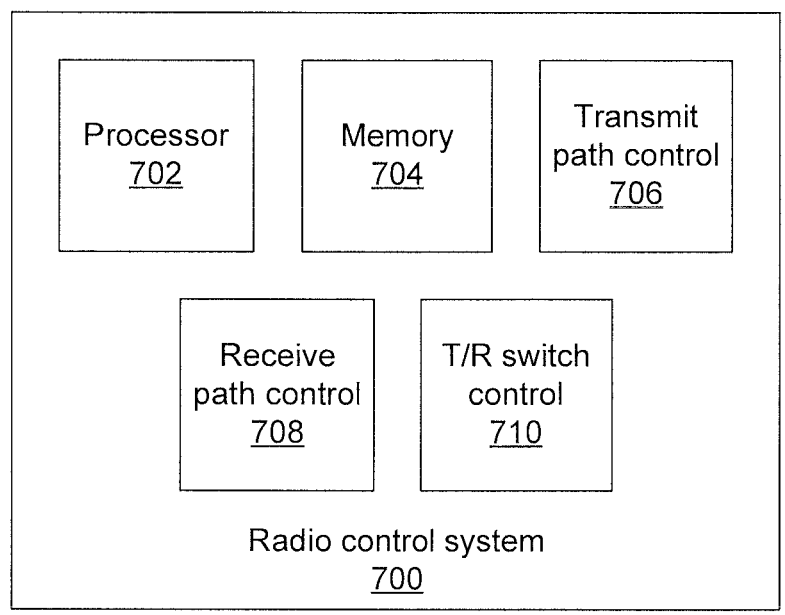
FIG. 7 is a block diagram of a radio control system in accordance with the present principles.

Referring now to FIG. 7, a radio control system 700 is shown. The radio control system 700 includes a hardware processor 702 and memory 704. It should be understood that the system 700 may include one or more modules that are implemented as software on the processor 702 and stored in memory 704. Alternatively, the modules may be implemented as discrete hardware components in the form of, for example, an application-specific integrated chip or field-programmable gate array.

A transmit path control 706 issues control signals to the transmit path 504 to set, for example, operations performed on the RF signal output by the transmitter 502. A receive path control 708, similarly, controls settings for the receive path 510. A transmit/receive switch control 710 changes the impedances of the transmit path 504 and receive path 508 seen by the antenna 108. The transmit/receive switch control 710 can additionally measure the output impedance of the PA 102 and enable an appropriate set of impedances in response to that measurement, which may be stored in memory 704.

Having described preferred embodiments of a efficient transmit and receive switches (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A radio front-end, comprising:
a transmit path comprising a power amplifier;
a receive path comprising a low-noise amplifier; and
a transmit/receive switch configured to connect the transmit path and the receive path to an antenna, the transmit/receive switch comprising a first switched reactive impedance connected in parallel with the power amplifier on the transmit path and a second switched reactive impedance in parallel with the low-noise amplifier on the receive path, said first switched reactive impedance having an impedance configured to neutralize a reactive impedance of the power amplifier, said second switched reactive impedance having an impedance configured to neutralize a reactive impedance of the low-noise amplifier, the transmit/receive switch being further configured to disconnect the second reactive impedance during reception.

2. The radio front-end of claim 1, wherein the first switched reactive impedance comprises a plurality of independently switched impedances arranged in parallel.

3. The radio front-end of claim 1, wherein the first switched reactive impedance is switched on during a reception stage and switched off during a transmission stage.

4. The radio front-end of claim 1, wherein the transmit/receive switch connects the transmit path to the antenna by a minimal-length path having a length determined by a minimum feature pitch.

5. The radio front-end of claim 1, wherein the transmit/receive switch further comprises a one-quarter wavelength transmission line connecting the low-noise amplifier to the antenna.

6. The radio front-end of claim 5, wherein the transmit-receive switch further comprises a switch connected to ground in parallel with the low-noise amplifier that is closed during transmission.

7. A method for radio control, comprising:
connecting a first reactive impedance in parallel with a power amplifier on a transmit path during reception to neutralize a reactive impedance of the power amplifier and to prevent received signals from entering the transmit path;
connecting a second reactive impedance in parallel with a low-noise amplifier on a receive path during transmission to neutralize a reactive impedance of the low-noise amplifier;
disconnecting the first reactive impedance during transmission; and
disconnecting the second reactive impedance during reception.

8. The method of claim 7, wherein the first reactive impedance comprises a plurality of independently switched impedances arranged in parallel.

9. The method of claim 8, wherein connecting the first reactive impedance comprises connecting a set of the independently switched impedances selected to most closely match the reactive impedance of the power amplifier.

10. The method of claim 9, further comprising measuring the reactive impedance of the power amplifier.

11. The method of claim 7, further comprising setting a receive path to a high impedance during transmission by shorting the receive path to ground at a point between a low-noise amplifier and a one-quarter wavelength transmission line.

12. The method of claim 11, further comprising setting the receive path to a low impedance during reception by disconnecting the ground at the point between the low-noise amplifier and the one-quarter wavelength transmission line.

13. A system for radio control, comprising:
a transmit/receive switch control configured to connect a first reactive impedance in parallel with a power amplifier on a transmit path during reception to neutralize a reactive impedance of the power amplifier, to connect a second reactive impedance in parallel with a low-noise amplifier on a receive path during transmission to neutralize a reactive impedance of the low-noise amplifier, to prevent received signals from entering the transmit path and further configured to disconnect the first reactive impedance during transmission, and to disconnect the second reactive impedance during reception.

14. The system of claim 13, wherein the first reactive impedance comprises a plurality of independently switched impedances arranged in parallel.

15. The system of claim 14, wherein the transmit/receive switch control is further configured to connect a set of the independently switched impedances selected to most closely match the reactive impedance of the power amplifier.

* * * * *